United States Patent
Chung et al.

(10) Patent No.: US 8,146,171 B2
(45) Date of Patent: *Apr. 3, 2012

(54) DIGITAL GARMENT USING DIGITAL BAND AND FABRICATING METHOD THEREOF

(75) Inventors: Gi Soo Chung, Gyeonggi-do (KR); Dae Hoon Lee, Gyeonggi-do (KR); Jae Sang An, Gyeonggi-do (KR)

(73) Assignee: Korea Institute of Industrial Technology, Chungcheongnam-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/531,944

(22) PCT Filed: Aug. 14, 2008

(86) PCT No.: PCT/KR2008/004730
§ 371 (c)(1),
(2), (4) Date: Sep. 18, 2009

(87) PCT Pub. No.: WO2009/107907
PCT Pub. Date: Sep. 3, 2009

(65) Prior Publication Data
US 2010/0325770 A1    Dec. 30, 2010

(30) Foreign Application Priority Data

Feb. 26, 2008    (KR) .......................... 10-2008-0017486

(51) Int. Cl.
*A41D 27/02* (2006.01)
*D03D 15/02* (2006.01)
*D03D 15/00* (2006.01)

(52) U.S. Cl. .................. 2/69; 2/76; 2/167; 2/902; 2/901
(58) Field of Classification Search ........................ None
See application file for complete search history.

(56) References Cited

U.S. PATENT DOCUMENTS 4,369,622 A * 1/1983 Teed et al. ....................... 57/315
(Continued)

FOREIGN PATENT DOCUMENTS

CN           86108915           7/1987
(Continued)

OTHER PUBLICATIONS

International Search Report mailed Feb. 24, 2009 for PCT/KR2008/004730.

*Primary Examiner* — Bobby Muromoto, Jr.
(74) *Attorney, Agent, or Firm* — Yoo & Associates

(57) ABSTRACT

Disclosed is a digital garment that can provide a high-speed communication path by using a digital band that is quickly and easily attachable to a conventional garment (clothes), and a fabricating method thereof. The digital garment includes: a garment formed of textile; a digital band provided along the outside or inside of the garment so as to provide a communication path; a sensor, attached to the garment, being electrically coupled to the digital band, converting a physical signal into an electrical signal; an operation device, attached to the garment, being electrically coupled to the digital band, receiving the electrical signal from the sensor and processing the signal; and a communication module, attached to the garment, being electrically coupled to the digital band so as to perform wireless communication.

20 Claims, 6 Drawing Sheets

U.S. PATENT DOCUMENTS

| | | | | |
|---|---|---|---|---|
| 4,661,403 A * | 4/1987 | Morin | | 428/367 |
| 4,753,088 A * | 6/1988 | Harrison et al. | | 66/202 |
| 4,813,219 A * | 3/1989 | Rees | | 57/3 |
| 5,074,129 A * | 12/1991 | Matthew | | 66/192 |
| 5,206,085 A * | 4/1993 | Nakagawa et al. | | 428/372 |
| 5,248,548 A * | 9/1993 | Toon | | 428/222 |
| 5,416,961 A * | 5/1995 | Vinay | | 28/165 |
| 5,617,713 A * | 4/1997 | Mawick et al. | | 57/210 |
| 5,991,922 A * | 11/1999 | Banks | | 2/69 |
| 6,032,450 A * | 3/2000 | Blum | | 57/75 |
| 6,047,203 A * | 4/2000 | Sackner et al. | | 600/388 |
| 6,066,093 A * | 5/2000 | Kelly et al. | | 600/386 |
| 6,260,344 B1 * | 7/2001 | Chakravarti | | 57/230 |
| 6,318,060 B1 * | 11/2001 | Dinkelmann et al. | | 57/3 |
| 6,341,504 B1 * | 1/2002 | Istook | | 66/172 E |
| 6,534,175 B1 * | 3/2003 | Zhu et al. | | 428/365 |
| 6,767,498 B1 * | 7/2004 | Talley et al. | | 264/474 |
| 6,854,296 B1 * | 2/2005 | Miller, III | | 66/190 |
| 6,941,775 B2 * | 9/2005 | Sharma | | 66/202 |
| 7,135,227 B2 * | 11/2006 | Karayianni et al. | | 428/370 |
| 7,144,830 B2 * | 12/2006 | Hill et al. | | 442/205 |
| 7,155,891 B2 * | 1/2007 | Bader | | 57/210 |
| 7,191,803 B2 * | 3/2007 | Orr et al. | | 139/421 |
| 7,337,012 B2 * | 2/2008 | Maghribi et al. | | 607/152 |
| 7,337,810 B2 * | 3/2008 | Orr et al. | | 139/421 |
| 7,365,031 B2 * | 4/2008 | Swallow et al. | | 442/301 |
| 7,381,187 B2 * | 6/2008 | Coulston et al. | | 600/490 |
| 7,413,802 B2 * | 8/2008 | Karayianni et al. | | 428/370 |
| 7,491,892 B2 * | 2/2009 | Wagner et al. | | 174/254 |
| 7,504,127 B2 * | 3/2009 | Karayianni et al. | | 427/118 |
| 7,559,902 B2 * | 7/2009 | Ting et al. | | 600/529 |
| 7,560,671 B2 * | 7/2009 | Wheeler et al. | | 219/538 |
| 7,592,276 B2 * | 9/2009 | Hill et al. | | 442/301 |
| 7,665,288 B2 * | 2/2010 | Karayianni et al. | | 57/3 |
| 7,670,295 B2 * | 3/2010 | Sackner et al. | | 600/483 |
| 7,762,953 B2 * | 7/2010 | Derchak et al. | | 600/300 |
| 7,765,835 B2 * | 8/2010 | Karayianni et al. | | 66/172 E |
| 7,775,029 B2 * | 8/2010 | Chung et al. | | 57/210 |
| 7,779,656 B2 * | 8/2010 | Dias et al. | | 66/202 |
| 7,781,051 B2 * | 8/2010 | Burr et al. | | 428/221 |
| 7,809,433 B2 * | 10/2010 | Keenan | | 600/544 |
| 7,845,153 B2 * | 12/2010 | Chung et al. | | 57/210 |
| 7,849,888 B2 * | 12/2010 | Karayianni et al. | | 139/426 R |
| 7,870,761 B2 * | 1/2011 | Valentine et al. | | 66/171 |
| 7,871,661 B2 * | 1/2011 | Maghribi et al. | | 427/58 |
| 7,878,030 B2 * | 2/2011 | Burr | | 66/173 |
| 7,901,756 B2 * | 3/2011 | Burr et al. | | 428/123 |
| 7,902,095 B2 * | 3/2011 | Hassonjee et al. | | 442/377 |
| 7,926,254 B2 * | 4/2011 | Karayianni et al. | | 57/310 |
| 7,980,141 B2 * | 7/2011 | Connor et al. | | 73/849 |
| 7,984,604 B2 * | 7/2011 | Chung et al. | | 57/9 |
| 2003/0051458 A1 * | 3/2003 | Kim | | 57/10 |
| 2004/0237494 A1 * | 12/2004 | Karayianni et al. | | 57/212 |
| 2007/0038057 A1 * | 2/2007 | Nam et al. | | 600/388 |
| 2007/0054037 A1 * | 3/2007 | Karayianni et al. | | 427/118 |
| 2007/0275199 A1 * | 11/2007 | Chen | | 428/36.1 |
| 2008/0182103 A1 * | 7/2008 | Chung et al. | | 428/365 |
| 2009/0056300 A1 * | 3/2009 | Chung et al. | | 57/256 |
| 2009/0145533 A1 * | 6/2009 | Karayianni et al. | | 156/47 |
| 2010/0325770 A1 * | 12/2010 | Chung et al. | | 2/69 |
| 2011/0000412 A1 * | 1/2011 | Chung et al. | | 112/78 |
| 2011/0005187 A1 * | 1/2011 | Chung et al. | | 57/232 |
| 2011/0010001 A1 * | 1/2011 | Chung et al. | | 700/141 |
| 2011/0130060 A1 * | 6/2011 | Chung et al. | | 442/189 |

FOREIGN PATENT DOCUMENTS

| | | |
|---|---|---|
| JP | 2005-146499 | 6/2005 |
| JP | 2007-527957 | 10/2007 |
| JP | 2008-184727 | 8/2008 |
| JP | 2009-518057 | 5/2009 |
| KR | 10-0729676 | 6/2007 |
| KR | 10-0760594 | 10/2007 |

* cited by examiner

… (1)

DIGITAL GARMENT USING DIGITAL BAND AND FABRICATING METHOD THEREOF

This application claims the priority of Korean Patent Application No. 10-2008-0017486, filed on Feb. 26, 2008 in the KIPO (Korean Intellectual Property Office), the disclosure of which is incorporated herein entirely by reference. Further, this application is the National Stage application of International Application No. PCT/KR2008/004730, filed Aug. 14, 2008, which designates the United States and was published in English. Each of these applications is hereby incorporated by reference in their entirety into the present application.

TECHNICAL FIELD

The present invention relates to a digital garment using a digital band and a fabricating method thereof, and more particularly, to a digital garment that can provide a high-speed communication path by using a digital band that is quickly and easily attachable to a conventional garment (clothes), and a fabricating method thereof.

BACKGROUND ART

In the ubiquitous era, it has been demanded to communicate information by accessing a network in real time everywhere and every time. Accordingly, a digital garment worn by human is required to be connected to the near network and perform such a function. As a result, a digital yarn has been used because the digital yarn can conduct electrons so as to send information and can be woven and knitted to make clothes.

However, there has been a problem that it takes a very long process time to make the digital garment by using the digital yarn because the digital yarn should be connected to a connector piece by piece.

In addition, additional work of connecting the digital yarn to seam portions of clothes is required to make the clothes. Accordingly, manufacturing process becomes complicated. In addition, when the digital yarn is attached to the conventional clothes, the digital yarn reprocessing is required. Thus, the process becomes complicated.

DISCLOSURE OF THE INVENTION

Technical Problem

The present invention has been made to solve the above-mentioned problems occurring in the prior art. An object of the present invention is to provide a digital garment that can provide a high-speed communication path by using a digital band that is quickly and easily attachable to a conventional garment (clothes), and a fabricating method thereof.

Technical Solution

According to an aspect of the present invention, there is provided a digital garment using a digital band, which includes: a garment formed of textile; a digital band provided along the outside or inside of the garment so as to provide a communication path; a sensor, attached to the garment, being electrically coupled to the digital band, converting a physical signal into an electrical signal; an operation device, attached to the garment, being electrically coupled to the digital band, receiving the electrical signal from the sensor and processing the signal; and a communication module, attached to the garment, being electrically coupled to the digital band so as to perform wireless communication.

The digital band may be formed integrally with the garment, or attached to the garment.

The digital band may include a plurality of warps formed in parallel to each other in a first direction and a plurality of woofs formed in parallel to each other in a second direction perpendicular to the first direction, where the warps may include at least one digital yarn to provide the communication path.

In addition, the number of the digital yarn may be less than three hundreds.

The digital yarn may include at least one metal portion that is located at the center about a diameter of the digital yarn and provides a communication path, and a coating portion surrounding the outside of the metal portion so as to shield the metal portion from electromagnetic wave.

The digital yarn may include an outer metal portion arranged along an outer circumference edge of the coating portion and an outer coating portion surrounding the outer metal portion.

In addition, the warps may include a plurality of normal warps that are formed in parallel to each other in the first direction and formed of single or more strands, and at least one digital yarn formed between the normal warps.

The digital yarn may be arranged in parallel to the normal warp inside the edge of the digital band.

The normal warp may be arranged to the edge of the digital band.

In addition, the digital band may include symmetrical tape pairs and a plurality of digital yarns formed between the tapes, where the tapes may be adhered to each other so as to press the digital yarns in a radial direction.

The digital yarns may be arranged with equal spaces between each other.

According to another aspect of the present invention, there is provided a method of fabricating a digital garment using a digital band, which comprises: (a) preparing a garment formed of textile; (b) preparing a digital band that includes warps and woofs perpendicular to the warps, where the warps include at least one digital yarn; (c) attaching the digital band to the garment; and (d) attaching a device to the garment and then electrically coupling the device to the digital band.

In the step (b), the warps including the digital yarn may be arranged in parallel to each other in the first direction and the woofs may be let off in the second direction so as to cross between the warps.

In addition, in the step (b), the warps may be arranged in parallel to each other in the first direction, where the warps include a plurality of normal warps formed of single or more strands and at least one digital yarn formed between the normal warps.

In the step (b), the normal warps may be arranged at the edge of the digital band.

In the step (b), the digital yarn may include a metal portion located at the center about a diameter of the digital yarn and a coating portion surrounding the metal portion.

In the step (b), the digital yarn may further include a plurality of outer metal portions and an outer coating portion surrounding the outer metal portions.

In addition, in the step (c), the digital band may be attached to the garment by sewing the normal warps arranged at the edge of the digital band.

According to a still another aspect of the present invention, there is provided a method of fabricating a digital garment using a digital band, which comprises: (a) preparing a garment formed of textile; (b) preparing a digital band that includes at least one digital yarns arranged in parallel to each other and symmetrical tape pairs surrounding the digital yarn; (c) attaching the digital band to the garment; and (d) attaching a device to the garment and then electrically coupling the device to the digital band.

In the step (c), the digital band may be attached to the garment by heating the tape of the digital band or sewing the edge of the tape.

In addition, in the step (d), the device including a sensor, an operation device and a communication module may be attached to the garment and then electrically coupled to the digital band.

Advantageous Effects

According to the digital garment using the digital band and fabricating method thereof of the present invention, the fabric type digital band is formed of the warps including the digital yarn and the woofs arranged in perpendicular to the warps and then the digital band is attached to the conventional clothes. Thus, the digital garment to provide a high-speed communication path can be easily manufactured using the conventional clothes.

BRIEF DESCRIPTION OF THE DRAWINGS

The above objects, other features and advantages of the present invention will become more apparent by describing the preferred embodiments thereof with reference to the accompanying drawings, in which.

MODE FOR CARRYING OUT THE INVENTION

Figure 1:
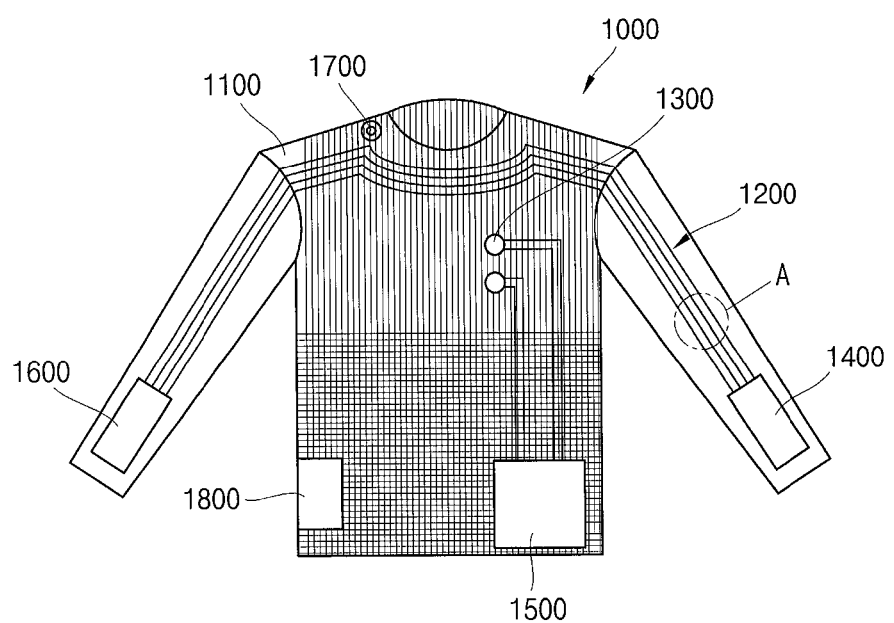
FIG. 1 is a perspective view illustrating a digital garment using a digital band according to one exemplary embodiment of the present invention.

Hereinafter, preferred embodiments of the present invention will be described in detail with reference to the accompanying drawing. The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present invention is only defined within the scope of the appended claims. In the entire description of the present invention, the same drawing reference numerals are used for the same elements across various figures.

Construction of a digital garment 1000 using a digital band according to one exemplary embodiment of the present invention will be explained below.

Figure 2:
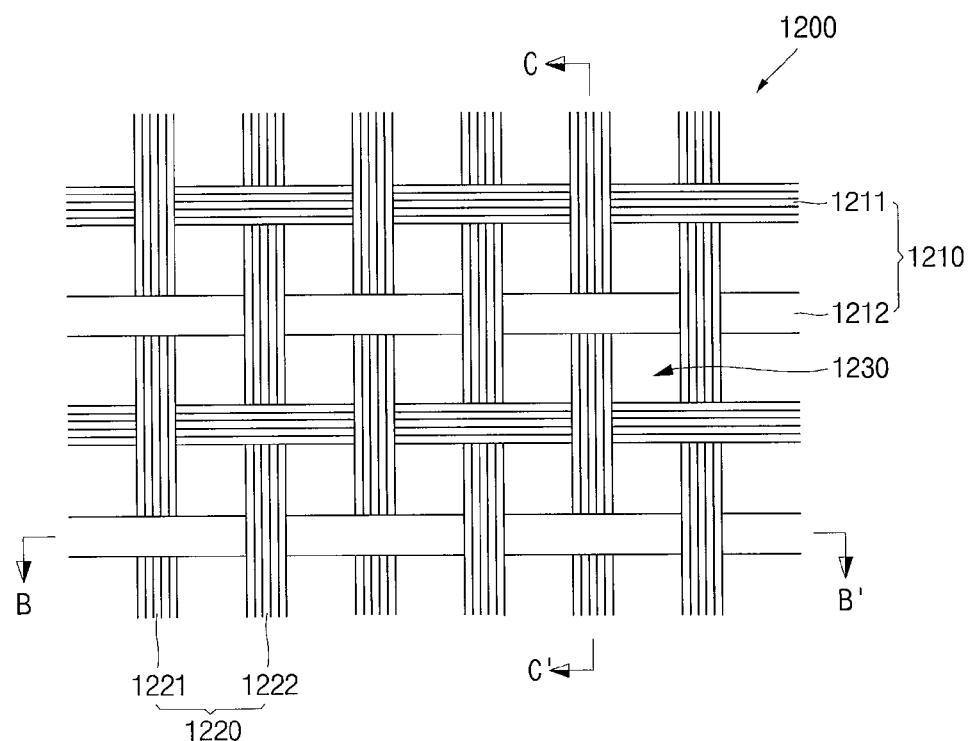
FIG. 2 is a magnified view illustrating "A" portion of FIG. 1.
Figure 3:
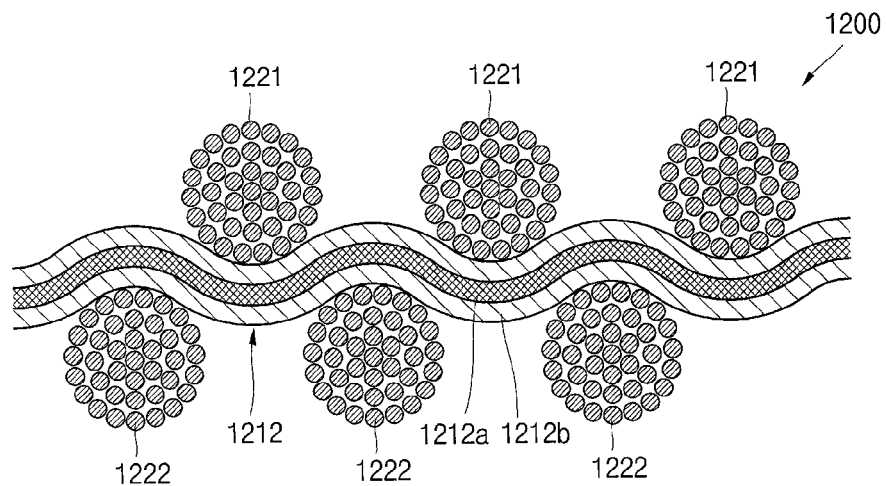
FIG. 3 is a sectional view taken along B-B' line of FIG. 2.
Figure 4:
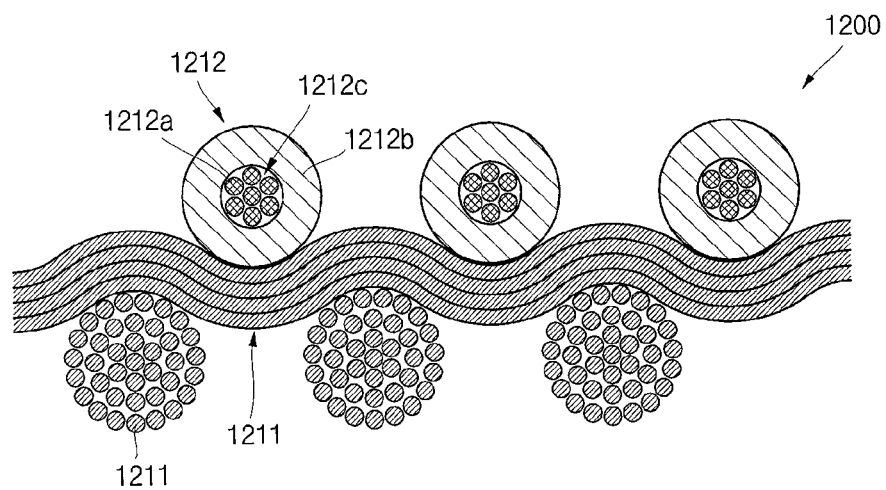
FIG. 4 is a sectional view taken along C-C' line of FIG. 2.
Figure 5:
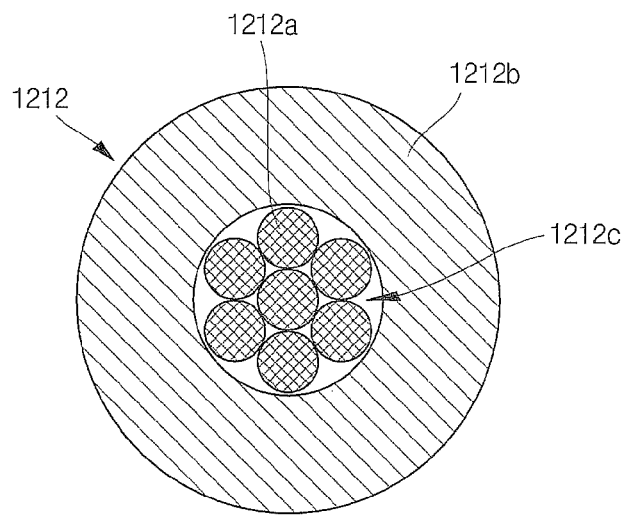
FIGS. 5 and 6 are sectional views illustrating a digital yarn used in the digital garment using the digital band.
Figure 6:
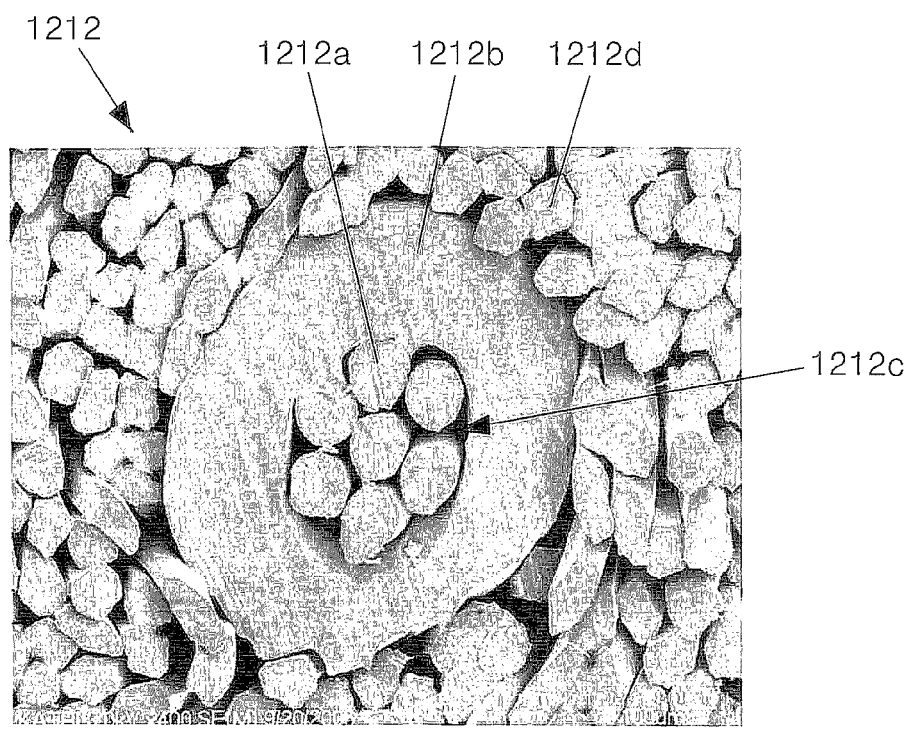

FIG. 1 is a perspective view illustrating the digital garment 1000 using the digital band and FIG. 2 is a magnified view illustrating "A" portion of FIG. 1 and FIG. 3 is a sectional view taken along B-B' line of FIG. 2 and FIG. 4 is a sectional view taken along C-C' line of FIG. 2 and FIGS. 5 and 6 are sectional views illustrating a digital yarn 1212 used in the digital garment 1000 using the digital band.

Referring to FIGS. 1 to 4, and FIGS. 5 and 6, the digital garment 1000 using the digital band includes a usual garment 1100, a digital band 1200 attached to the garment 1100, a sensor 1300 that is attached to the garment 1100 and electrically coupled to the digital band 1200, an operation device 1500 and a communication module 1700. In addition, the digital garment 1000 using the digital band may further include an input pad 1400 that is attached to the garment 1100 and electrically coupled to the digital band 1200, and a display 1600 or an electrical module 1800.

The garment 1100 may be a usual clothes. In addition, the garment 1100 is shown as an upper garment in FIG. 1, but not limited thereto. In other words, the garment 1100 may be a lower garment, a dress or any other clothes.

The digital band 1200 is attached to the garment 1100 according to the shape of the garment 1100. The digital band 1200 may be formed along the outside or inside of the garment 1100. In addition, the digital band 1200 itself may a portion (not shown) of fabric of the garment 1100.

The digital band 1200 includes digital yarns inside so as to provide a communication path to an adjacent computing device. The digital band 1200 may include a plurality of warps 1210 and a plurality of woofs 1220 arranged in perpendicular to the warp 1210.

The warps 1210 are arranged in parallel to each other in a first direction with predetermined gaps in a second direction perpendicular to the first direction. The first direction means a length direction of the digital band 1200. In addition, the warps 1210 include a plurality of normal warps 1211 and digital yarns 1212 that are arranged in the second direction.

The normal warp 1211 is formed of yarns. The yarn means threads to constitute fabric of clothes. In addition, referring to FIGS. 1 to 5, the normal warp 1211 has a double strands structure that is formed as single strand type by twisting several strands of yarns. However, the structure of the normal warp 1211 is not limited to the double strands structure. The normal warp 1211 may be formed of single strand that is one strand of yarn.

The normal warps 1211 are arranged at the edge of the digital band 1200 about the second direction. Accordingly, when the digital band 1200 is attached to the garment 1100, the normal warp 1211 located at the edge may be sewn. In addition, the normal warps 1211 are arranged in parallel to the digital yarn 1212 inside the edge of the digital band 1200.

The digital yarns 1212 are arranged in parallel to the normal warp 1211 in the first direction. The digital yarn 1212 provides the digital band 1200 with a high-speed communication path to the adjacent computing device.

The number of the digital yarn 1212 may be less than three hundreds. In the embodiment, at least one digital yarn 1212 may be included in the digital garment 1000 using the digital band. If the number of the digital yarn 1212 is more than three hundreds, the digital yarn 1212 may be damaged by repeated motion when they are attached to the clothes.

The digital yarn 1212 includes at least one metal portion 1212a located at the center about the diameter of the digital yarn 1212 and a coating portion 1212b surrounding the metal portion 1212*a*. In addition, a pore 1212*c*, that is, vacant space may be formed between the coating portion 1212*b* and metal portion 1212*a*. Cover yarns 1212*d* may be additionally formed to cover the outer circumference edge of the coating portion 1212*b*.

The metal portion 1212*a* is made of metal that has low electrical resistance and high elastic restoring force against repeated bending. The metal portion 1212*a* may be made of any one selected from copper, copper alloy, silver, silver alloy, gold, gold alloy and brass, or mixture thereof. In addition, seven metal portions 1212*a* are provided in the drawing, but not limited thereto.

The coating portion 1212*b* is formed to surround the metal portion 1212*a*. The coating portion 1212*b* shields human body from electromagnetic wave generated from the metal portion 1212*a* when the digital band 1200 is used for the high-speed communication. In addition, the coating portion 1212*b* shields the metal portion 1212*a* inside the digital band 1200 from external noise electromagnetic wave. For that purpose, the coating portion 1212*b* may be made of any one selected from ETFE (Ethylenetetrafluoroethylene), FEP (Fluorinated Ethylenepropylene), PTFE (Polytetrafluoroethylene), PVDF (Polyvinylidenefluoride), PFA (Perfluoroalkoxy) and its equivalents, but not limited thereto.

The cover yarn 1212*d* may be formed in plural number to surround the outer circumference edge of the coating portion 1212*b*. The cover yarn 1212*d* may be formed of yarn to constitute the normal warp 1211. The cover yarns 1212*d* are formed to surround the digital yarn 1212, thereby protecting the metal portion 1212*a* and coating portion 1212*b* therein. In other words, the cover yarn 1212*d* can absorbs impact generated when the digital yarn 1212 is repeatedly bent, thereby preventing the metal portion 1212*a* and coating portion 1212*b* inside from being cut.

The woofs 1220 are formed in plural number in the second direction perpendicular to the warp 1210. In addition, the plurality of woofs 1220 are arranged in parallel to each other with predetermined gaps in the first direction. The digital band 1200 is formed by weaving the woof 1220 and warp 1210 together. The woof 1220 may have a structure of single strand or double strands similarly to the normal warp 1211.

The woofs 1220 include two groups, that is, first and second woofs 1221 and 1222 according to the arrangement row. The first and second woofs 1221 and 1222 are arranged to be adjacent to each other. For example, the first woof 1221 may be the woof arranged in each odd row and the second woof 1222 may be the woof arranged in each even row.

The first woofs 1221 are arranged in the second direction perpendicular to the warp 1210 so as to cross the warp 1210. The first woof 1221 are arranged to pass through each space formed by the gaps between the warps 1210 arranged in parallel to each other. In other words, the first woof 1221 is formed zigzag between upper and lower parts of the plane formed by the warp 1210.

The second woofs 1222 are adjacent to the first woof 1221 and arranged in the second direction. The second woof 1222 are also arranged to pass through each space formed by the gaps between the warps 1210. However, the passing direction is opposite to the passing direction of the first woof 1221. Accordingly, the second woof 1222 can press upper and lower parts of the warp 1210 with the first woof 1221, thereby fixing the warp 1210. As a result, the digital band 1200 can be formed by weaving the warp 1210 and woof 1220 together.

The sensor 1300 is attached to the garment 1100 and electrically coupled to the digital band 1200. The sensor 1300 can sense various physical signals such as movement, vibration, temperature and pressure of a user or peripheral objects and convert the sensed signals into electrical signals. In addition, the sensor 1300 may be provided in plural number according to use thereof. The electrical signal converted from the signal sensed by the sensor 1300 is inputted to the communication module 1700 through the digital band 1200.

The input pad 1400 is attached to the garment 1100 and electrically coupled to the digital band 1200. The input pad 1400 is shown to be attached to a wrist portion of the garment 1100 for convenience of use, but not limited thereto. In addition, the input pad 1400 may be a keypad type or a touch screen type. When the input pad 1400 is the touch screen type, the input pad 1400 may be formed integrally with the display 1600.

The operation device 1500 is attached to the garment 1100 and electrically coupled to the digital band 1200. The operation device 1500 receives signals from the sensor 1300, input pad 1400 and communication module 1700, and then performs a series of operations such as analyzing and processing the signals. In addition, the operation device 1500 can apply electrical signal to the communication module 1700 via the digital band 1200 for communication.

The display 1600 is attached to the garment 1100 and electrically coupled to the digital band 1200. In addition, the display 1600 is electrically coupled to the operation device 1500 via the digital band 1200. Accordingly, the display 1600 can display the result processed by the operation device 1500 as images. The display 1600 may be formed of a liquid crystal display, an organic light emitting display (OLED) or its equivalents, but not limited thereto.

The communication module 1700 is attached to the garment 1100 and electrically coupled to the digital band 1200. In addition, the communication module 1700 is electrically coupled to the operation device 1500 via the digital band 1200. Accordingly, the communication module 1700 receives the result processed by the operation device 1500 and then communicates with an adjacent computing device.

The electrical module 1800 is attached to the garment 1100 and electrically coupled to the digital band 1200. Output/input terminals of the electrical module 1800 are housed according to a reference format. The electrical module 1800 may include various modules, for example, a semiconductor chip, a magnetic recording device, a capacitor, an inductor, a resistor, crystal, a coil, a varactor, a thermistor, a resonator, a transformer, an electrical circuit, an electro-optical circuit, an optical configuration electromagnetic circuit and a connector connectable to a magnetic array, but not limited thereto.

As described above, according to the digital garment 1000 using the digital band, the communication path to the peripheral computing device can be easily provided by sewing the digital band 1200 on the conventional garment 1100. In addition, various convenient functions such as display and communication for the user can be provided by attaching various devices 1300 to 1800 to the garment 1100 and electrically coupling the devices 1300 to 1800 to the digital band 1200 that provides the high-speed communication path.

Construction of a digital garment (not shown) using a digital band according to another embodiment of the present invention will be explained below.

Figure 7:
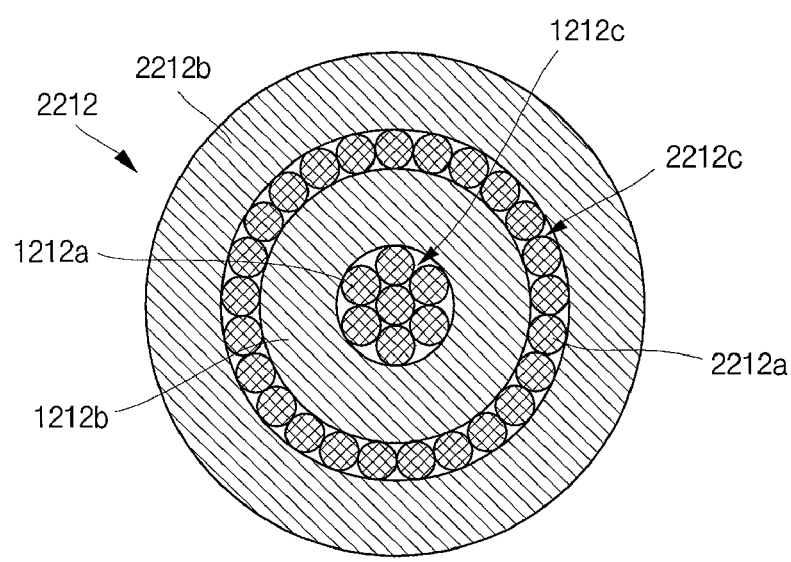
FIG. 7 is a sectional view illustrating a digital yarn used in a digital garment using a digital band according to another exemplary embodiment of the present invention.

FIG. 7 is a sectional view illustrating a digital yarn 2212 used in a digital garment using a digital band according to another exemplary embodiment of the present invention. The digital garment is the same as the above digital garment using the digital band according to one embodiment except for construction of the digital yarn 2212. The same drawing reference numerals are used for the same elements. Differences will be mainly explained below.

Referring to FIG. 7, the digital yarn 2212 used in the digital garment using the digital band includes a metal portion 1212a, a coating portion 1212b, a plurality of outer metal portions 2212a, and an outer coating portion 2212b surrounding the outer metal portion 2212a.

In addition, a pore 1212c may be formed between the metal portion 1212a and coating portion 1212b and also between the coating portion 1212b and outer metal portion 2212a and outer coating portion 2212b.

The plurality of outer metal portions 2212a are arranged with equal gaps along the outer circumference edge of the coating portion 1212b. In addition, the outer metal portion 2212a may be tightly arranged to surround the circumference of the coating portion 1212b.

The outer metal portion 2212a shield human body from electromagnetic wave generated by current flowing through the metal portion 1212a. In addition, the outer metal portions 2212a shield the metal portion 1212a from external electromagnetic wave noise.

The outer metal portion 2212a is made of the same material as the metal portion 1212a and formed outside the metal portion 1212a so as to have a sectional surface wider than a sectional surface of the metal portion 1212a. Accordingly, the outer metal portion 2212a can easily absorb electromagnetic wave generated from the metal portion 1212a and the external electromagnetic wave noise. As a result, the outer metal portion 2212a can improve electromagnetic wave shielding function of the coating portion 1212b.

The outer coating portion 2212b is formed to surround the outside of the outer metal portion 2212a. The outer coating portion 2212b is formed of the same material as the coating portion 1212b so as to intercept electromagnetic wave generated from the metal portion 1212a and the external electromagnetic wave noise.

Construction of a digital garment (not shown) using a digital band according to a still another embodiment of the present invention will be explained below.

Figure 8:
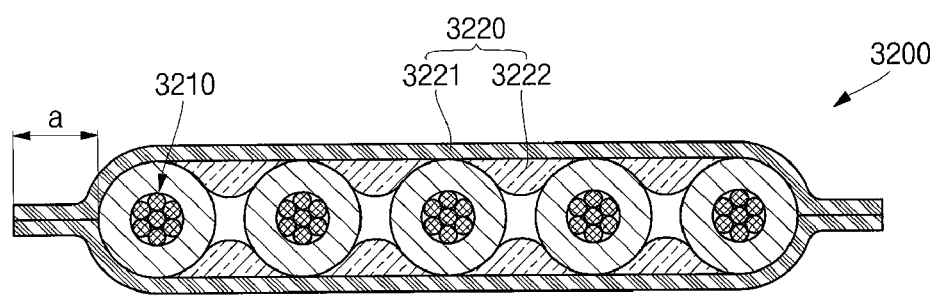
FIG. 8 is a sectional view illustrating a digital band used in a digital garment using the digital band according to a still another exemplary embodiment of the present invention.

FIG. 8 is a sectional view illustrating a digital band 3200 used in a digital garment using a digital band according to a still another exemplary embodiment of the present invention.

Referring to FIG. 8, the digital garment is the same as the above digital garment 1000 using the digital band according to the one embodiment except for construction of the digital band 3200. The same drawing reference numerals are used for the same elements. Differences will be mainly explained below.

The digital band 3200 includes a plurality of digital yarns 3210 that are arranged in parallel to each other in one direction, and a tape 3220 whose upper and lower parts are attached to each other so as to surround the digital yarn 3210 inside.

The digital yarn 3210 has the same construction as the digital yarn 1212 of the digital garment 1000 using the digital band according to the one embodiment except that the digital band 3200 does not include additional normal warp and woof. Accordingly, only the plurality of digital yarns 3210 are arranged in parallel to each other in the direction of the warp.

The tape 3220 is formed of a pair of upper and lower tapes that are symmetrical to each other. The upper and lower tapes are attached to each other with the digital yarn 3210 interposed between them. The tape presses the plurality of digital yarns 3210 in the radial direction and binds them together. Five digital yarn 3210 sealed by the tape 3220 are shown in FIG. 8, but not limited thereto.

The tape 3220 includes a surface part 3221 forming an outer part, and an adhesive part 3222 formed inside the surface part 3221.

The surface part 3221 forms the outer part of the tape 3220 and is not adhesive. The surface part 3221 may be formed of any one selected from polyurethane, PTFE (polytetra-fluoro-ethylene) and PVC (polyvinyl chloride) or mixtures thereof.

The adhesive parts 3222 are formed to be paired inside the surface part 3221 in the same shape as the surface part 3221. The adhesive part 3222 is adhesive. In addition, the plurality of digital yarns 3210 are sealed and fixed by attaching the adhesive part 3222 on the surface of the digital yarn 3210. The adhesive part 3222 may be formed of any one selected from polyurethane, nylon and polyester resin, or mixtures thereof.

The digital band 3200 is formed of the structure that the digital yarns 3210 are surrounded by the tape 3220. Accordingly, the digital band can be manufactured more easily and quickly compared than the fabric type digital band. Thus, productivity of the digital band 3200 is improved.

The digital band 3200 may be attached to a garment (not shown) by hot melting method. In other words, the surface part 3221 of the tape 3220 is attached to the garment by heating upper or lower surface of the digital band 3200. The surface part 3221 of the tape 3220 is not adhesive in itself. However, when the surface part 3221 is heated, it is deformed to be adhesive to the garment.

On the other hand, the digital band 3200 may be attached to the garment through sewing. The surface parts 3221 of the tape 3220 have edges (a) through which the surface parts 3221 are attached to each other. The edge (a) provides a margin by which the tapes 3220 are attached to each other in order to seal the digital yarn 3210. In addition, the digital band 3200 may be attached to the garment by sewing the edge (a) to the garment. In other words, the digital band 3200 may be attached to the garment by sewing the edge (a). The digital yarn 3210 inside can be prevented from being damaged when it is sewn.

As described above, in the digital garment using the digital band according to a still another exemplary embodiment, the digital band 3200 is formed by surrounding the plurality of digital yarns 3210 by the tape 3220. Accordingly, the digital band can be manufactured more easily and quickly compared than the fabric type digital band, thereby improving productivity. In addition, the digital garment can be easily attached to the conventional garment so as to provide a communication path similarly to the above embodiment.

A method of fabricating the digital garment 1000 using the digital band according to one embodiment of the present invention will be explained below.

Figure 9:
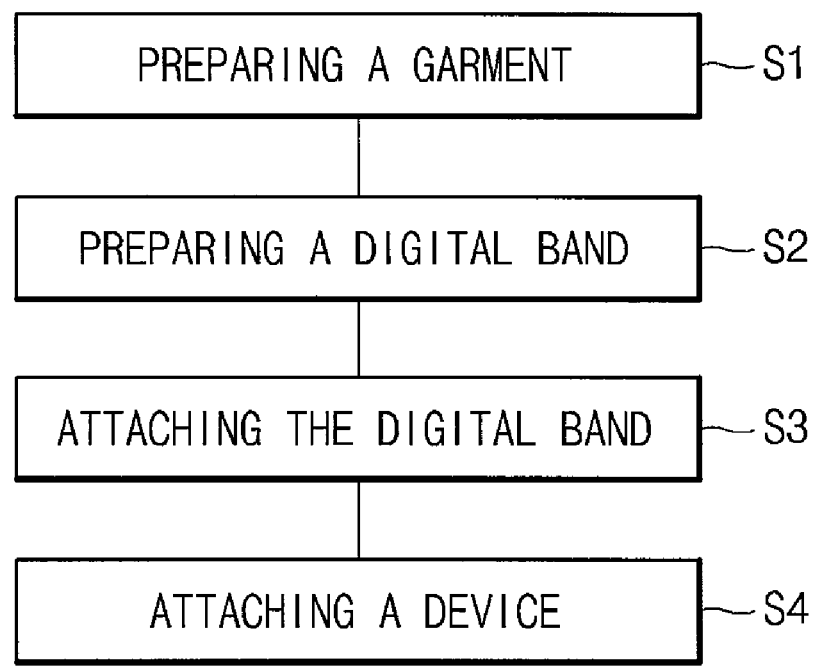
FIG. 9 is a flow chart illustrating a method of fabricating the digital garment using the digital band according to one exemplary embodiment of the present invention.

FIG. 9 is a flow chart illustrating a method of fabricating the digital garment 1000 using the digital band according to one exemplary embodiment of the present invention.

Referring to FIG. 9, the method of fabricating the digital garment 1000 using the digital band may include the steps of: preparing a garment (S1), preparing a digital band (S2), attaching the digital band (S3) and attaching a device (S4). Each step of FIG. 9 will be explained with reference to FIGS. 1 to 4, and FIGS. 5 and 6.

In the step S1, a basic garment 1100 of the digital garment 1000, that is, a usual clothes is prepared. The garment 1100 is shown as an upper garment in the drawing, but not limited thereto. The clothes may be any other garment such as a lower garment or a clothes whose upper and lower parts are integrated into single piece, etc.

In the step S2, first, the digital yarn 1212 is prepared.

The metal portion 1212a used in the digital yarn 1212 may be formed by drawing, extending and winding a metal portion made of the same material as the metal portion 1212a. The metal portion 1212a may be made of any one selected from copper, copper alloy, silver, silver alloy, gold, gold alloy and brass, or mixture thereof, but not limited thereto.

Next, the coating portion 1212b is formed on the outer circumference edge of the metal portion 1212a. The coating portion 1212b may be made of any one selected from ETFE (Ethylenetetrafluoroethylene), FEP (Fluorinated Ethylenepropylene), PTFE (Polytetrafluoroethylene), PVDF (Polyvinylidenefluoride), PFA (Perfluoroalkoxy) and its equivalents, but not limited thereto.

Then, the coating portion 1212b may be dried.

In the step S2, the fabric type digital band 1200 is formed by using the digital yarn 1212.

In the digital band 1200, the warp 1210 formed of the plurality of normal warps 1211 and the digital yarns 1212 are arranged in parallel to each other in the first direction. Then, the woofs 1220 are let off in the second direction perpendicular to the warp 1210. In addition, the woof 1220 include first and second woofs 1221 and 1222 that are adjacent to each other according to the arrangement row. The first and second woofs 1221 and 1222 pass through between the warps 1210 in the directions opposite to each other. Thus, the digital band 1200 is prepared by using the warp 1210 and woof 1220.

In the step S3, the digital band 1200 is attached to the garment 1100. The digital band 1200 can be attached to the garment 1100 through sewing because it is formed in the fabric type using the warp 1210 and woof 1220. In addition, the normal warp 1211 including single strand or double strands of yarn are arranged at the edge of the digital band 1200. Accordingly, the digital yarns 1212 are not damaged because the normal warps 1211 are sewn when the digital band 1200 is attached to the garment 1100 through sewing.

In the step S4, various devices 1300 to 1800 are attached to the garment 1100 and then electrically coupled to the digital band 1200.

The devices 1300 to 1800 may be attached to the garment 1100 by various methods. For example, the devices 1300 to 1800 may be formed as buttons and then attached to the garment 1100. Or, the devices 1300 to 1800 may be formed in the fabric type and then sewn on the garment 1100. Or, the devices 1300 to 1800 may be attached to the garment 1100 by being combined with a support member that is previously attached to the garment 1100.

In addition, the devices 1300 to 1800 may be electrically coupled to the digital band 1200 by a connector method or a welding method. Of course, the connection portion between the digital band 1200 and sensor 1300 is waterproofed for washing.

INDUSTRIAL APPLICABILITY

The digital garment according to the present invention can be applied to provide a high-speed communication path to the conventional clothes.

It should be understood by those of ordinary skill in the art that various replacements, modifications and changes in the form and details may be made therein without departing from the spirit and scope of the present invention as defined by the following claims. Therefore, it is to be appreciated that the above described embodiments are for purposes of illustration only and are not to be construed as limitations of the invention.

This work was supported by the IT R&D program of MIC/IITA. [2006-S-029-02, Design and Development of Woven UFC (Ubiquitous Fashionable Computer) Technology]

What is claimed is:

1. A digital garment using a digital band, comprising:
a garment formed of textile;
a digital band provided along the outside or inside of the garment so as to provide a communication path, wherein the digital band comprises a plurality of warps formed in parallel to each other in a first direction, and a plurality of woofs formed in parallel to each other in a second direction perpendicular to the first direction, wherein the warps comprise at least one digital yarn to provide the communication path;
a sensor, attached to the garment, being electrically coupled to the digital band, converting a physical signal into an electrical signal;
an operation device, attached to the garment, being electrically coupled to the digital band, receiving the electrical signal from the sensor and processing the signal; and
a communication module, attached to the garment, being electrically coupled to the digital band so as to perform wireless communication,
wherein the at least one digital yarn comprises at least one metal portion that is located at the center about a diameter of the digital yarn, a coating portion surrounding the outside of the at least one metal portion so as to shield the at least one metal portion from electromagnetic wave, an outer metal portion arranged along an outer circumference edge of the coating portion, and an outer coating portion surrounding the outer metal portion.

2. The digital garment of claim 1, wherein the digital band is formed integrally with the garment, or attached to the garment.

3. The digital garment of claim 1, wherein the total number of the at least one digital yarn is less than three hundreds.

4. The digital garment of claim 1, wherein the warps comprise a plurality of normal warps that are formed in parallel to each other in the first direction and formed of single or more strands, and the at least one digital yarn is formed between the normal warps.

5. The digital garment of claim 4, wherein the at least one digital yarn is arranged in parallel to the normal warps inside the edge of the digital band.

6. The digital garment of claim 4, wherein the normal warps are arranged to form the edge portion of the digital band along the first direction.

7. A digital garment using a digital band, comprising:
a garment formed of textile;
a digital band provided along the outside or inside of the garment so as to provide a communication path;
a sensor, attached to the garment, being electrically coupled to the digital band, converting a physical signal into an electrical signal;
an operation device, attached to the garment, being electrically coupled to the digital band, receiving the electrical signal from the sensor and processing the signal; and
a communication module, attached to the garment, being electrically coupled to the digital band so as to perform wireless communication,
wherein the digital band comprises:
symmetrical tape pairs; and
a plurality of digital yarns formed between the tapes, wherein the tapes are adhered to each other so as to press the digital yarns in a radial direction.

8. The digital garment of claim 7, wherein the digital yarns are arranged with equal spaces between each other.

9. A method of fabricating a digital garment using a digital band, comprising:
 (a) preparing a garment formed of textile;
 (b) preparing a digital band that includes warps and woofs perpendicular to the warps, wherein the warps include at least one digital yarn;
 (c) attaching the digital band to the garment; and
 (d) attaching a device to the garment and then electrically coupling the device to the digital band,
 wherein the at least one digital yarn comprises a metal portion located at the center about a diameter of the digital yarn, a coating portion surrounding the metal portion, an outer metal portion arranged along an outer circumference edge of the coating portion, and an outer coating portion surrounding the outer metal portion.

10. The method of fabricating the digital garment of claim 9, wherein in the step (b), the warps including the at least one digital yarn are arranged in parallel to each other in the first direction and the woofs are let off in the second direction so as to cross between the warps.

11. The method of fabricating the digital garment of claim 9, wherein in the step (b), the warps are arranged in parallel to each other in the first direction, wherein the warps includes a plurality of normal warps formed of single or more strands and the at least one digital yarn is formed between the normal warps.

12. The method of fabricating the digital garment of claim 11, wherein in the step (b), the normal warps are arranged at the edge of the digital band.

13. The method of fabricating the digital garment of claim 11, wherein in the step (c), the digital band is attached to the garment by sewing the normal warps arranged to form the edge portion of the digital band along the first direction.

14. A method of fabricating a digital garment using a digital band, comprising:
 (a) preparing a garment formed of textile;
 (b) preparing a digital band that includes at least one digital yarn arranged in parallel to each other and symmetrical tape pairs surrounding the at least one digital yarn;
 (c) attaching the digital band to the garment; and
 (d) attaching a device to the garment and then electrically coupling the device to the digital band.

15. The method of fabricating the digital garment of claim 14, wherein in the step (c), the digital band is attached to the garment by heating the tape of the digital band or sewing the edge of the tape.

16. The method of fabricating the digital garment of claim 9, wherein in the step (d), the device including a sensor, an operation device and a communication module is attached to the garment and then electrically coupled to the digital band.

17. The digital garment of claim 1, wherein the coating portion comprised a material selected from the group consisting of ethylene tetrafluoroethylene (ETFE), fluorinated ethylene propylene (FEP), polytetrafluoroethylene (PTFE), polyvinylidene fluoride (PVDF) and perfluroalkoxy (PFA).

18. The digital garment of claim 1, wherein a pore is formed in spaces between the at least one metal portion and the coating portion.

19. The method of fabricating the digital garment of claim 9, wherein the coating portion comprised a material selected from the group consisting of ethylene tetrafluoroethylene (ETFE), fluorinated ethylene propylene (FEP), polytetrafluoroethylene (PTFE), polyvinylidene fluoride (PVDF) and perfluroalkoxy (PFA).

20. The method of fabricating the digital garment of claim 9, wherein a pore is formed in spaces between the metal portion and the coating portion.

* * * * *